United States Patent
Scherer et al.

(10) Patent No.: US 12,126,126 B2
(45) Date of Patent: Oct. 22, 2024

(54) GLASS MOUNTED ELECTRONIC ASSEMBLY

(71) Applicant: Aptiv Technologies AG, Schaffhausen (CH)

(72) Inventors: M. Jarod Scherer, Wakefield, RI (US); Stefanie Merry, Barrington, RI (US); Tyler Folger, Warren, RI (US)

(73) Assignee: APTIV TECHNOLOGIES AG, Schaffhausen (CH)

( * ) Notice: Subject to any disclaimer, the term of this patent is extended or adjusted under 35 U.S.C. 154(b) by 510 days.

(21) Appl. No.: 17/569,079

(22) Filed: Jan. 5, 2022

(65) Prior Publication Data

US 2022/0294164 A1 Sep. 15, 2022

Related U.S. Application Data

(60) Provisional application No. 63/137,467, filed on Jan. 14, 2021.

(51) Int. Cl.
| | | |
|---|---|---|
| *H01R 24/00* | (2011.01) | |
| *H01Q 1/12* | (2006.01) | |
| *H01Q 1/24* | (2006.01) | |
| *H01R 24/50* | (2011.01) | |
| *H01R 43/20* | (2006.01) | |
| *H05K 1/14* | (2006.01) | |
| *H05K 1/18* | (2006.01) | |
| *H05K 5/00* | (2006.01) | |

(Continued)

(52) U.S. Cl.
CPC ........... *H01R 24/50* (2013.01); *H01Q 1/1271* (2013.01); *H01Q 1/24* (2013.01); *H01R 43/205* (2013.01); *H05K 1/147* (2013.01); *H05K 1/18* (2013.01); *H05K 5/0034* (2013.01); *H05K 5/0069* (2013.01); *H01R 12/52* (2013.01); *H01R 12/55* (2013.01); *H05K 2201/10098* (2013.01); *H05K 2201/10189* (2013.01); *H05K 2201/10356* (2013.01)

(58) Field of Classification Search
CPC ........ H01R 24/50; H01R 12/52; H01R 12/55; H01R 43/205; H01Q 1/1271; H01Q 1/24
See application file for complete search history.

(56) References Cited

U.S. PATENT DOCUMENTS

| | | | |
|---|---|---|---|
| 8,814,601 B1 * | 8/2014 | Sherrer | H01R 24/50 29/852 |
| 10,205,216 B2 | 2/2019 | Talty et al. | |
| 2003/0203717 A1 * | 10/2003 | Chuprun | H04B 7/18591 455/12.1 |

FOREIGN PATENT DOCUMENTS

| | | |
|---|---|---|
| PE | 102010049103 A1 | 4/2012 |
| PE | 202018105085 U1 | 9/2018 |

OTHER PUBLICATIONS

Extended European Search Report for EP Application No. 22151347. 6, dated Jun. 10, 2022, 11 pages.

* cited by examiner

*Primary Examiner* — Phuong Chi Thi Nguyen
(74) *Attorney, Agent, or Firm* — Billion & Armitage

(57) ABSTRACT

An electronic assembly includes a circuit board having a plurality of conductive traces and electronic components forming an electronic circuit disposed thereon, a plurality of flexible electrical terminals configured to attach to electrical contacts disposed on a glass surface and electrically connected to the plurality of conductive traces, and a coaxial cable connector electrically connected to the plurality of conductive traces. A method of manufacturing an electronic assembly, e.g., the electronic assembly described above, is also presented herein.

20 Claims, 8 Drawing Sheets

(51) Int. Cl.
*H01R 12/52* (2011.01)
*H01R 12/55* (2011.01)

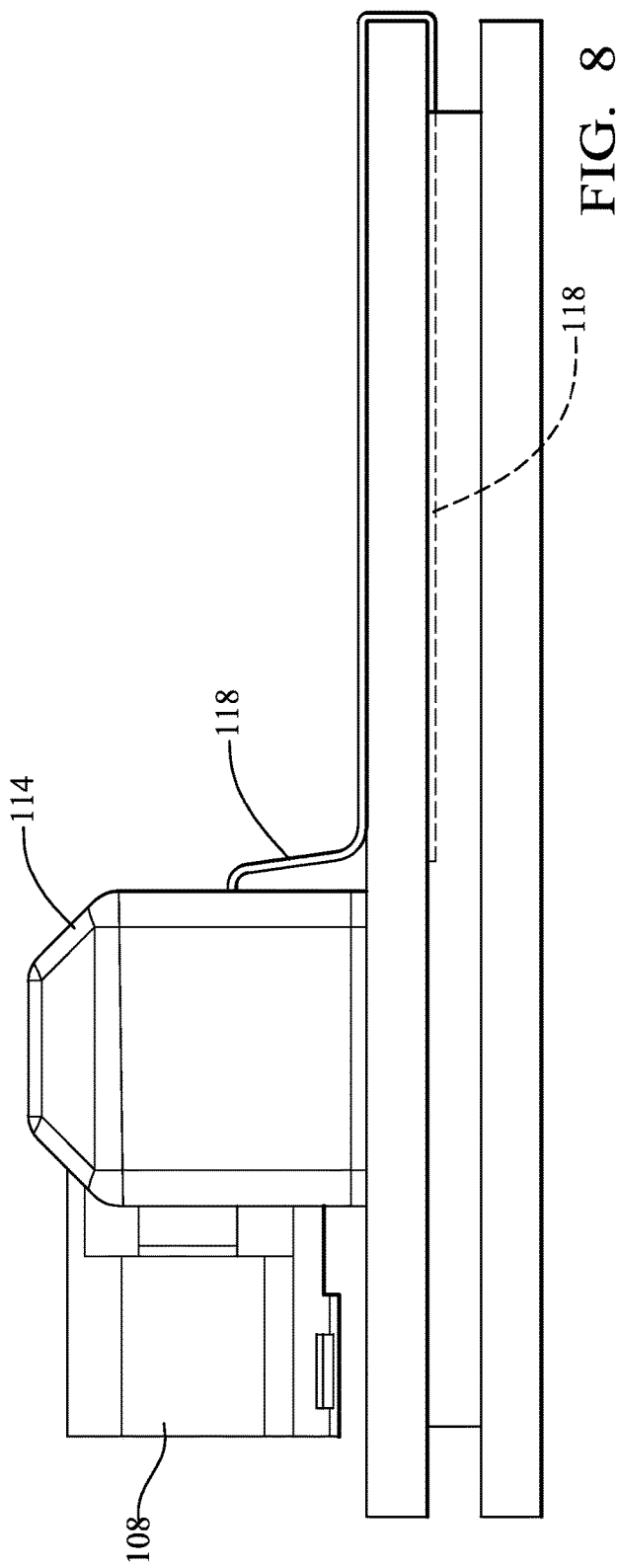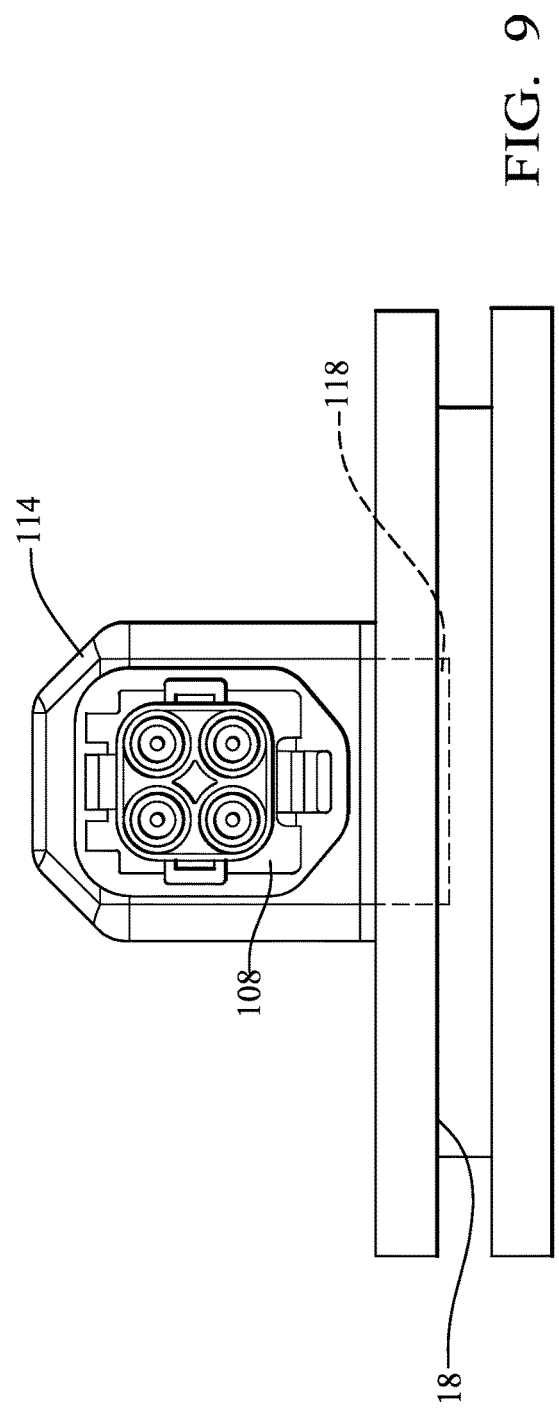

GLASS MOUNTED ELECTRONIC ASSEMBLY

CROSS-REFERENCE TO RELATED APPLICATION

This application claims benefit of priority to U.S. Application No. 63/137,467 filed on Jan. 14, 2021, the entire disclosure of which is hereby incorporated by reference.

BACKGROUND

Antenna modules capable of receiving radio signal at various frequencies from various sources, e.g., terrestrial and satellite radio, have been housed in external antenna assemblies that are mounted on the exterior portions of motor vehicles. These antenna assemblies, typically known as "shark fins" may be mounted to the roof or trunk lid of the vehicle. These antenna assemblies are susceptible to damage due to their location on an exterior surface of the vehicle. These antenna assemblies also require an opening in the exterior of the vehicle to route cabling from electronic systems in the vehicle to the antenna modules. The opening needs to be sealed to prevent water or other contaminants from entering the vehicle interior and failure of that seal can damage the vehicle's headliner or other internal structures and devices due to water intrusion.

SUMMARY

This patent application is directed to an electronic assembly, particularly a radio receiver or transmitter module that is configured to be mounted to a glass surface, such as a motor vehicle window having an antenna pattern printed thereon to which the receiver module is connected. The module has flexible terminals that are configured to attached to the antenna's contact pads. The flexible terminals may be connected to antenna connect pads that are on the outer surface of the glass surface on may be connected to antenna contact pads that are on the inner surface of the glass surface. The electronic assembly may also include a radio transmitter, a radio receiver, or a radio transceiver.

According to one or more aspects of the present disclosure, an electronic assembly includes a circuit board having a plurality of conductive traces and electronic components forming an electronic circuit, for example a radio receiver circuit, disposed thereon. The electronic assembly also includes a plurality of flexible electrical terminals configured to attach to electrical contacts disposed on a glass surface and electrically connected to the plurality of conductive traces. The electronic assembly further includes a coaxial cable connector electrically connected to the plurality of conductive traces.

In one or more embodiments of the electronic assembly according to the previous paragraph, the electronic assembly additionally includes a housing encasing the circuit board, a portion of the plurality of flexible electrical terminals, and a portion of the coaxial cable connector.

In one or more embodiments of the electronic assembly according to any one of the previous paragraphs, the housing encases the circuit board, the portion of the plurality of flexible electrical terminals, and the portion of the coaxial cable connector.

In one or more embodiments of the electronic assembly according to any one of the previous paragraphs, the housing is in intimate contact with the circuit board, the portion of the plurality of flexible electrical terminals, and the portion of the coaxial cable connector.

In one or more embodiments of the electronic assembly according to any one of the previous paragraphs, the electronic assembly further includes an adhesive layer disposed on an outer surface of the housing configured to secure the electronic assembly to a planar glass surface.

In one or more embodiments of the electronic assembly according to any one of the previous paragraphs, the plurality of flexible electrical terminals is formed of a sheet metal material. Each terminal in the plurality of flexible electrical terminals defines serpentine curves. The serpentine curves provide flexibility to the plurality of flexible electrical terminals.

In one or more embodiments of the electronic assembly according to any one of the previous paragraphs, the electronic assembly also includes the electrical contacts disposed on the glass surface and conductive antenna elements disposed on the glass surface and electrically interconnected to the electrical contacts.

In one or more embodiments of the electronic assembly according to any one of the previous paragraphs, the plurality of flexible electrical terminals is formed by a flat flexible cable.

In one or more embodiments of the electronic assembly according to any one of the previous paragraphs, the electronic assembly additionally includes the electrical contacts disposed on the glass surface. The flat flexible cable is disposed between the glass surface and a polymer layer and conductive antenna elements disposed on the glass surface and electrically interconnected to the electrical contacts.

In one or more embodiments of the electronic assembly according to any one of the previous paragraphs, the plurality of flexible electrical terminals is formed of thin conductive layers and is disposed between two polymer layers.

In one or more embodiments of the electronic assembly according to any one of the previous paragraphs, the two polymer layers are formed of a polyimide polymer.

According to one or more aspects of the present disclosure, a method of manufacturing an electronic assembly includes the steps of providing a circuit board having a plurality of conductive traces and electronic components forming a radio receiver circuit disposed thereon, connecting a plurality of flexible electrical terminals configured to attach to electrical contacts disposed on a glass surface to the plurality of conductive traces, connecting a coaxial cable connector to the plurality of conductive traces, and forming a housing by over molding the circuit board, a portion of the plurality of flexible electrical terminals, and a portion of the coaxial cable connector with a dielectric polymeric material.

In one or more embodiments of the method according to the previous paragraph, the housing is in intimate contact with the circuit board, the portion of the plurality of flexible electrical terminals, and the portion of the coaxial cable connector.

In one or more embodiments of the method according to any one of the previous paragraphs, the housing is in intimate contact with the circuit board, the portion of the plurality of flexible electrical terminals, and the portion of the coaxial cable connector.

In one or more embodiments of the method according to any one of the previous paragraphs, the method further includes the steps of attaching the plurality of flexible electrical terminals to electrical contacts disposed on a glass surface having conductive antenna elements disposed thereon that are electrically interconnected to the electrical contacts and attaching the housing to the glass surface.

In one or more embodiments of the method according to any one of the previous paragraphs, the plurality of flexible electrical terminals is formed by a flat flexible cable. The method also includes the steps of disposing the flat flexible cable between the glass surface and a polymer layer and connecting the flat flexible cable to the electrical contacts which are electrically interconnected to conductive antenna elements disposed on the glass surface.

In one or more embodiments of the method according to any one of the previous paragraphs, the plurality of flexible electrical terminals is formed of a sheet metal material. Each terminal in the plurality of flexible electrical terminals defines serpentine curves. The serpentine curves provide flexibility to the plurality of flexible electrical terminals.

DESCRIPTION OF THE DRAWINGS

FIG. 8 is a side plan view of the glass mounted radio receiver assembly of FIG. 6 according to some embodiments;

FIG. 9 is an end plan view of the glass mounted radio receiver assembly of FIG. 6 according to some embodiments;

DETAILED DESCRIPTION

Figure 1:
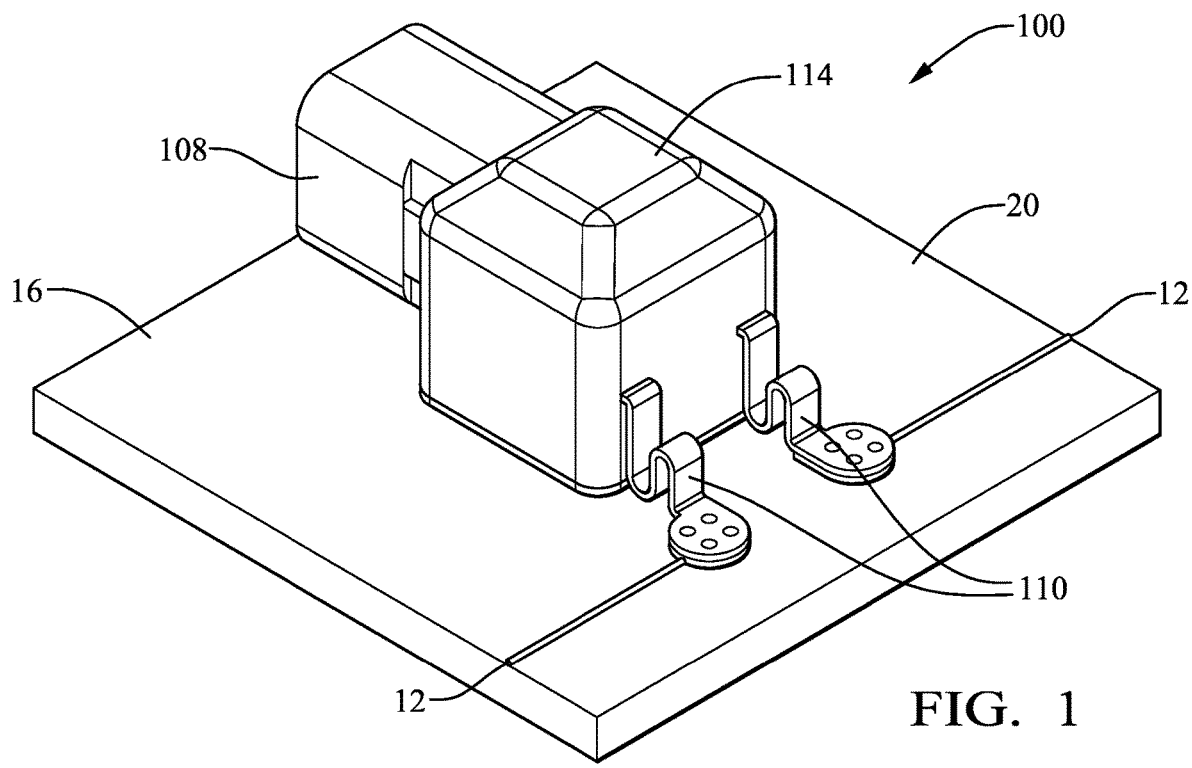
FIG. 1 is a perspective view of a glass mounted radio receiver assembly according to some embodiments.
Figure 2:
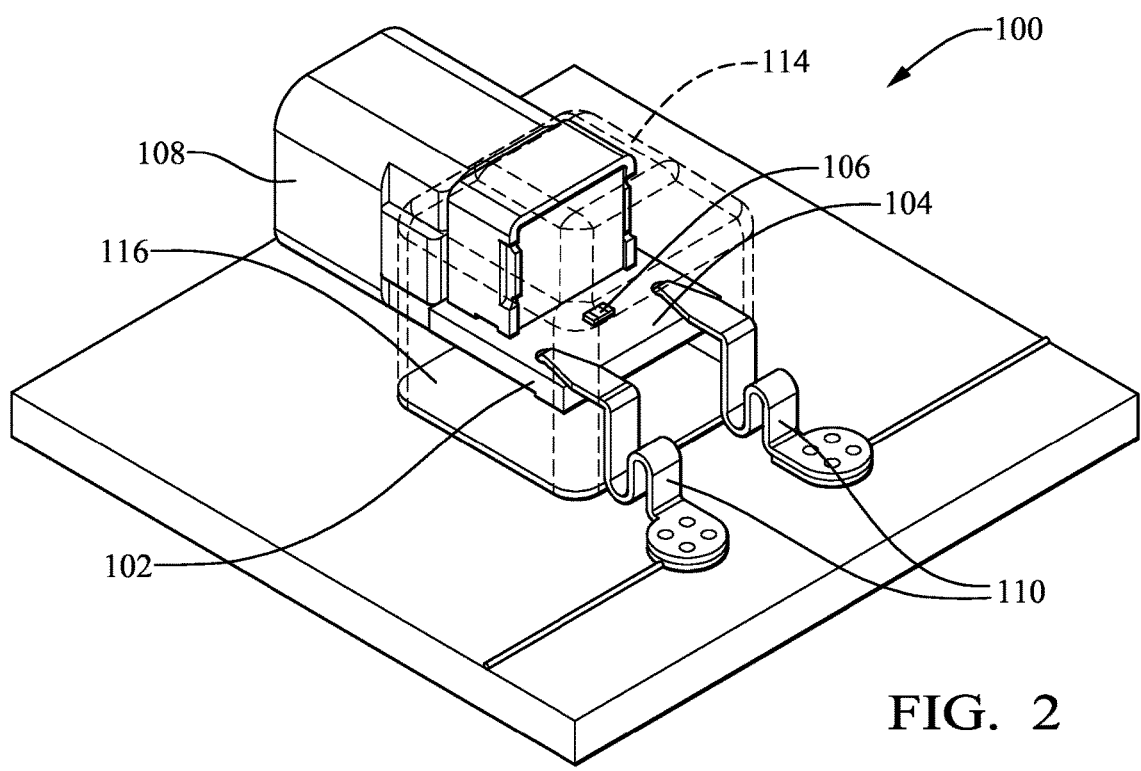
FIG. 2 is a perspective cut-away view of the glass mounted radio receiver assembly of FIG. 1 according to some embodiments.
Figure 3:
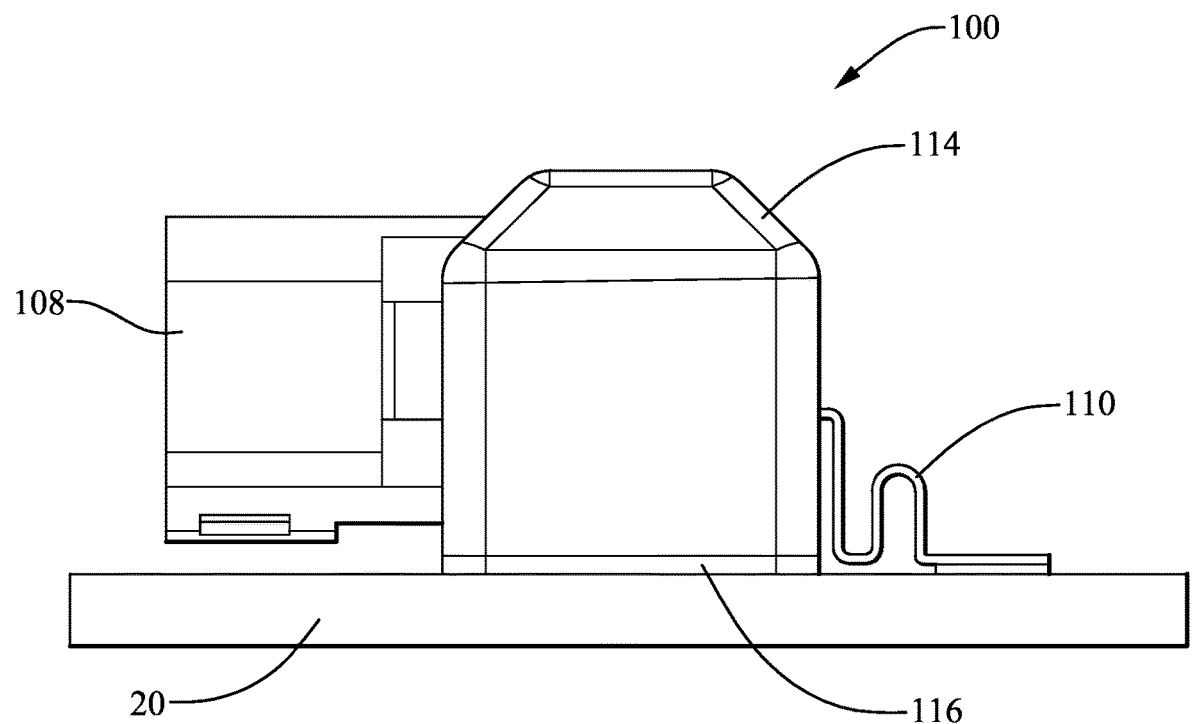
FIG. 3 is a side plan view of the glass mounted radio receiver assembly of FIG. 1 according to some embodiments.
Figure 4:
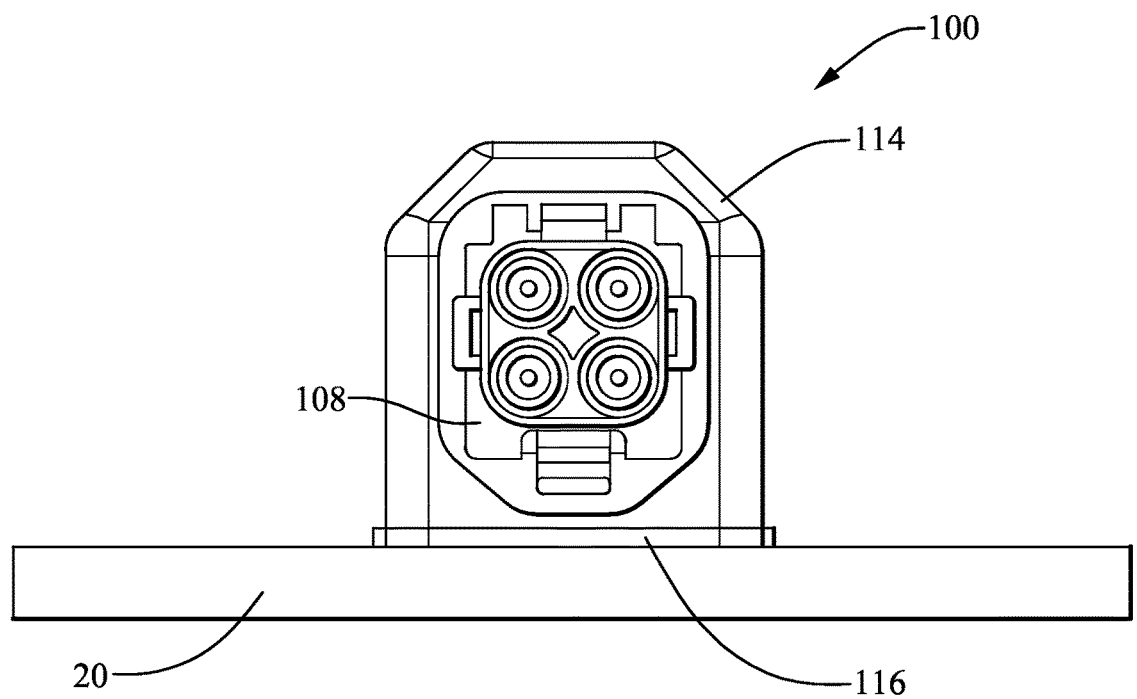
FIG. 4 is an end plan view of the glass mounted radio receiver assembly of FIG. 1 according to some embodiments.
Figure 5:
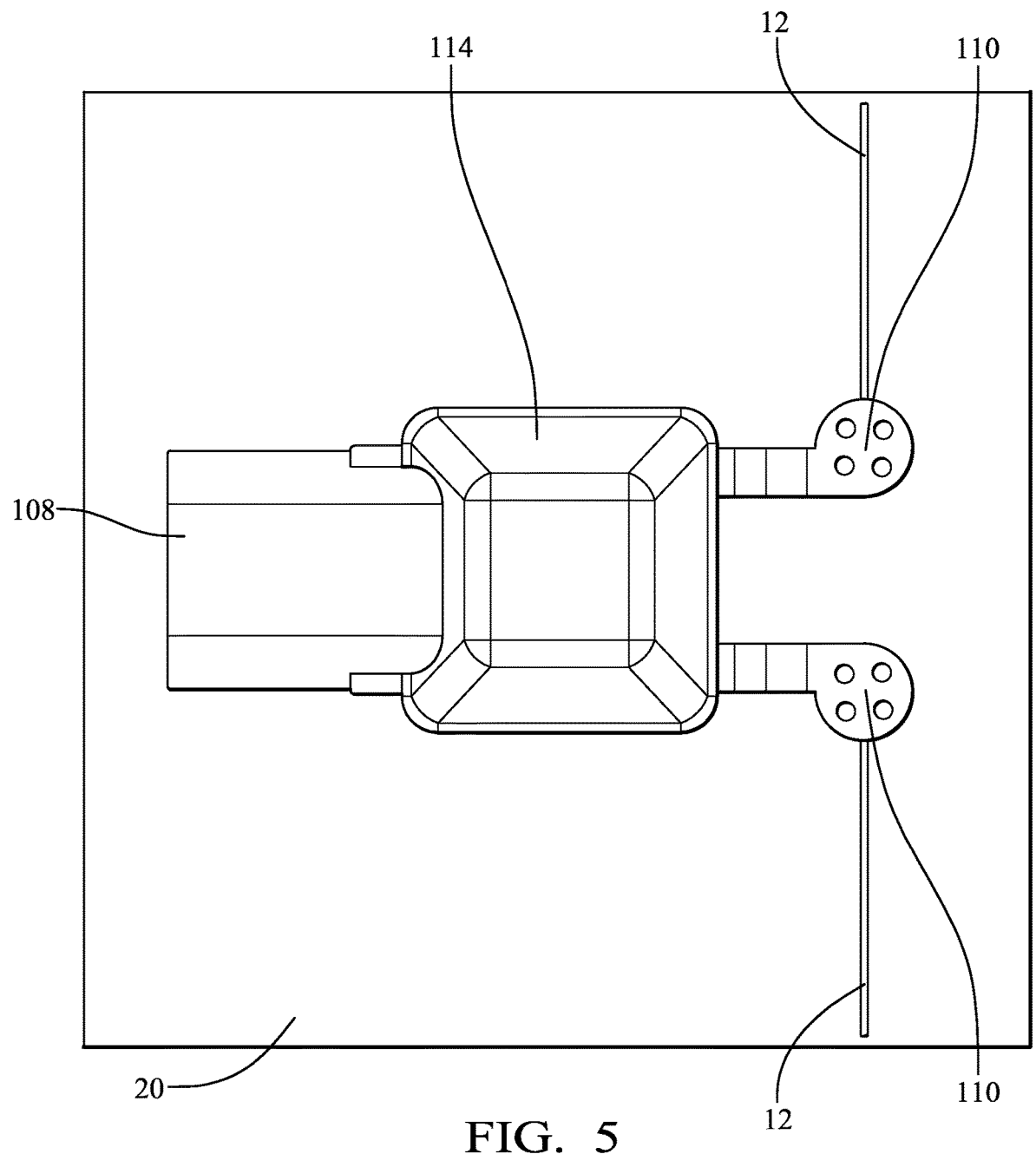
FIG. 5 is a top plan view of the glass mounted radio receiver assembly of FIG. 1 according to some embodiments.
Figure 6:
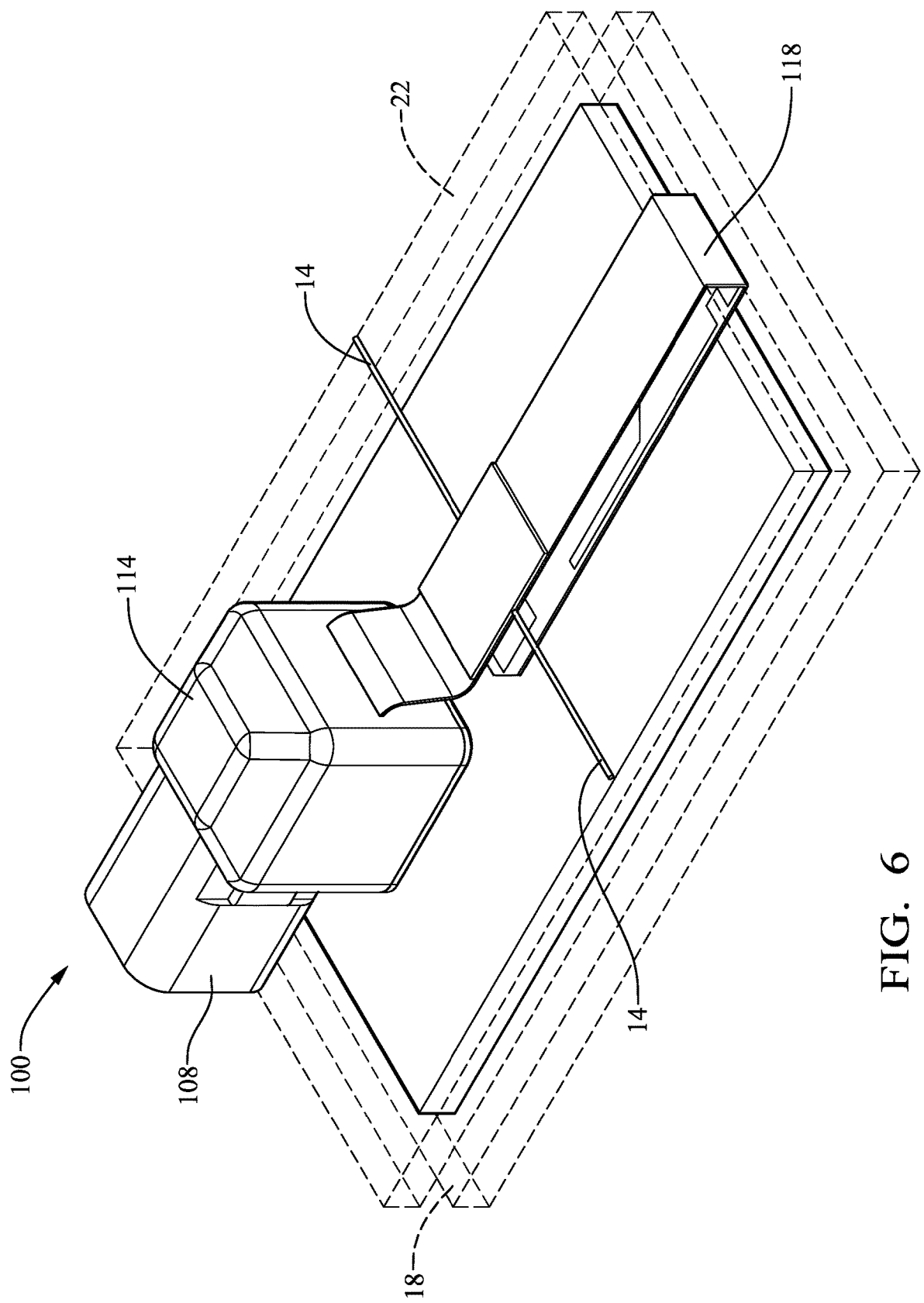
FIG. 6 is a perspective view of a glass mounted radio receiver assembly according to some embodiments.
Figure 7:
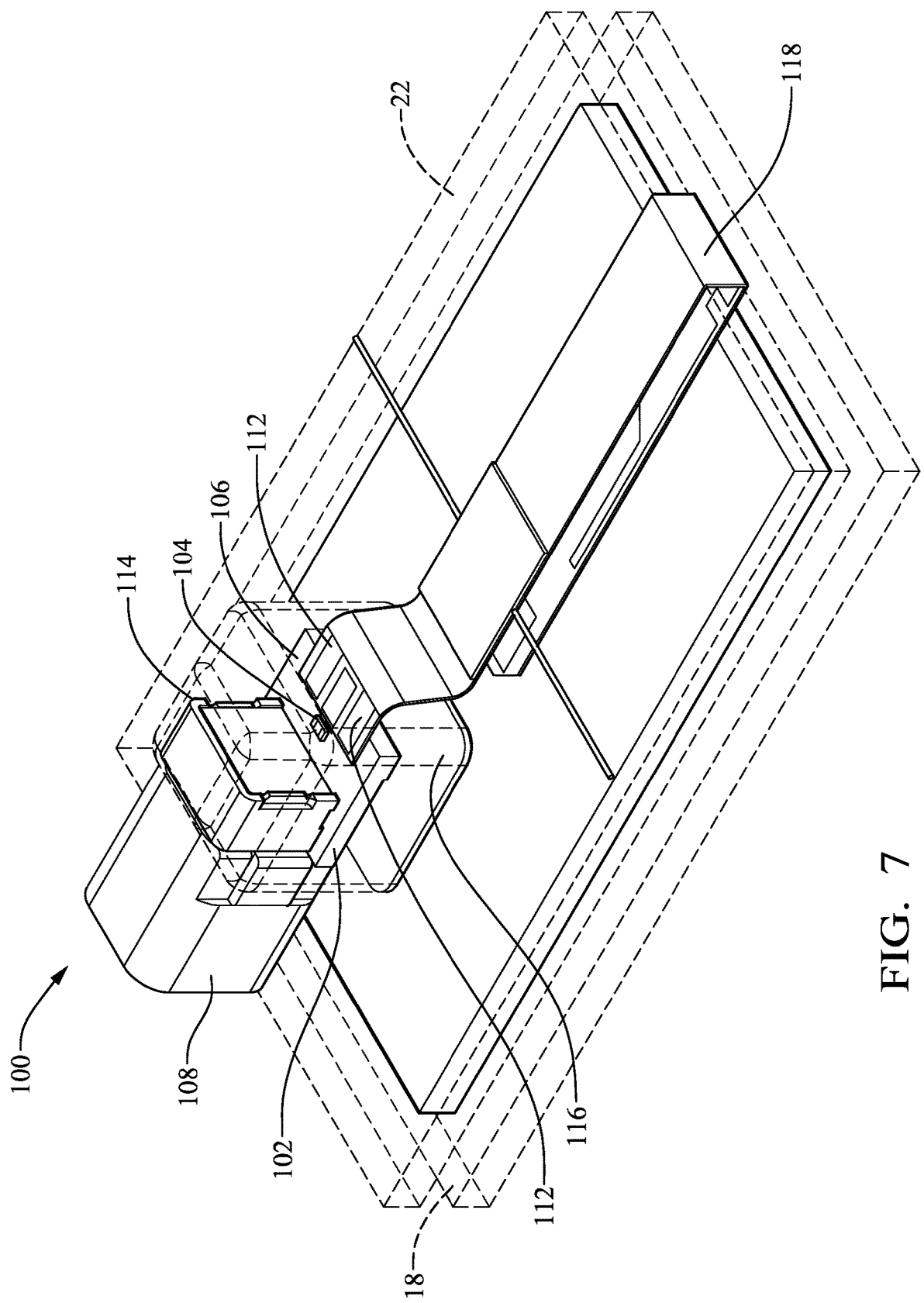
FIG. 7 is a perspective cut-away view of the glass mounted radio receiver assembly of FIG. 6 according to some embodiments.
Figure 10:
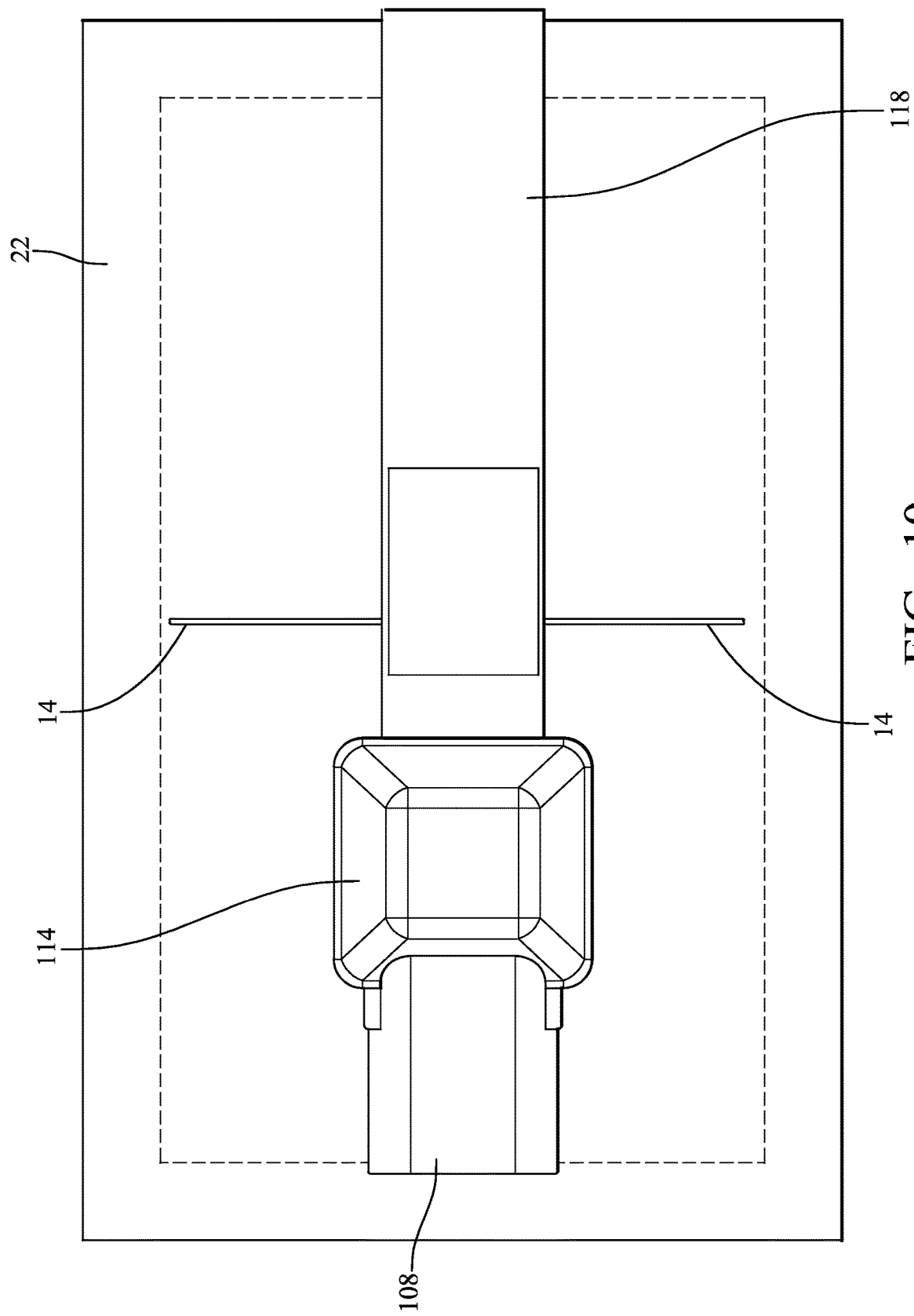
FIG. 10 is a top plan view of the glass mounted radio receiver assembly of FIG. 6 according to some embodiments.

FIGS. 1-10 show various non-limiting examples of a glass mounted electronic assembly 100 that provides a self-contained, direct connection system to electrically conductive antenna elements 12, 14 that are printed on an exterior glass surface 16 or embedded between inner surfaces of laminated glass plates 18 of a glass window 20, 22, such as a rear window of a motor vehicle. The glass mounted electronic assembly 100 may contain electronic circuitry for receiving and/or transmitting radio signals, e.g., terrestrial AM/FM radio, satellite radio (e.g., SIRIUS XM satellite radio), digital audio broadcasting (DAB), wireless local area network (WLAN), cellular telephone, vehicle to vehicle (V2V), vehicle to infrastructure (V2I), and/or terrestrial digital video broadcasting (DVB-T/T2) signals.

The electronic assembly includes a circuit board having a plurality of conductive traces 104, hereinafter referred to as a printed circuit board (PCB) 102. The PCB 102 may use a circuit board substrate that is formed of epoxy or polyimide resins. The resin may be reinforced with a woven glass cloth or other matrix such as chopped fibers. Substrates formed of such materials are typically referred to as FR-4 or G-10 type circuit boards. The PCB 102 may alternatively be constructed of ceramic or rigid polymer materials. This listing of acceptable substrate materials is not exhaustive and other materials may also be used successfully. A layer of conductive material, such as a copper-based material is electroplated on at least one major surface of the PCB 102. The layer of conductive material is then etched to create the conductive traces and second contact regions typically by using a chemical, photochemical, radiation (e.g., laser, electron beam, X-ray, gamma radiation) and/or mechanical etching processes. Alternatively, the layer of conductive material forming the conductive traces may be screen printed on the substrate.

The electronic assembly 100 further includes electronic components 106 that are disposed on the PCB 102 and interconnected the plurality of conductive traces 104, thereby forming electronic circuits, such as a radio receiver, a radio transmitter, or a radio transceiver circuit disposed thereon. The electronic components 106 may include, but are not limited to, integrated circuits, transistors, diodes, capacitors, inductors, and resistors.

The electronic assembly illustrated in FIGS. 1-10 further includes plurality of coaxial cable connectors 108 that are electrically connected to the plurality of conductive traces 104 on the PCB 102. The coaxial cable connectors 108 illustrated herein conform to the United States Council for Automotive Research (USCAR) USCAR-18 standard. The coaxial cable connectors 108 provide electrical connections between the electronic assembly 100 and another electronic circuit in the vehicle (not shown). The illustrated embodiment of the electronic assembly 100 has four coaxial connectors, but other embodiments of the electronic assembly 100 may contain more or fewer coaxial connectors, depending on the particular intended application of the electronic assembly.

The electronic assembly 100 also includes a plurality of flexible electrical terminals 110, 112 that are configured to attach to the antenna elements 12 via electrical contact pads that are disposed on or within the glass surface 16 and electrically connected to the plurality of conductive traces 104 on the PCB 102.

The electronic assembly 100 additionally includes a housing 114 that encases or encloses the entire PCB 102, a portion of the plurality of flexible electrical terminals 110, 112, and a portion of the coaxial cable connector 108. The example housing 114 is formed of a dielectric polymeric material and provides protection for the PCB 102, the plurality of conductive traces 104, and the electronic components 106, particularly from environmental contaminants. The housing 114 may be formed by over-molding as described in the method 200 below. so that the housing 114 is in intimate contact with the PCB 102, the portion of the plurality of flexible electrical terminals 110, 112, and the portion of the coaxial cable connector 108.

The electronic assembly 100 further includes an adhesive layer 116 that is disposed on an outer surface of the housing 114. This adhesive layer 116 is configured to secure the electronic assembly 100 to the glass surface 16.

As shown in FIGS. 1-5, the plurality of flexible electrical terminals 110 is formed of a sheet metal material. Each terminal in the plurality of flexible electrical terminals 110 defines meandering or serpentine curves. The plurality of flexible electrical terminals 110 is cut from a planar sheet of metal, such as a tin plated copper material, and bent or folded into the desired shape having the serpentine curves. These serpentine curves provide flexibility to the plurality of flexible electrical terminals 112. The free ends of the flexible electrical terminals are soldered to the contact pads on the glass surface 16, preferably by a lead-free solder containing indium.

As shown in FIGS. 6-10, the plurality of flexible electrical terminals 112 is formed by a flat flexible cable 118. The flat flexible cable 118 is disposed between the glass plates 18 and a polymer layer of the glass window 22. The conductive antenna elements 14 are embedded between laminated glass plates 18 and electrically interconnected to the electrical contacts, preferably by a lead-free indium containing solder.

The flat flexible cable 118 is formed of thin conductive layers and is disposed between two polymer layers. The two polymer layers are preferably formed of a polyimide polymer, such as KAPTON manufactured by DuPont de Nemours, Inc. of Wilmington, Delaware.

Figure 11:
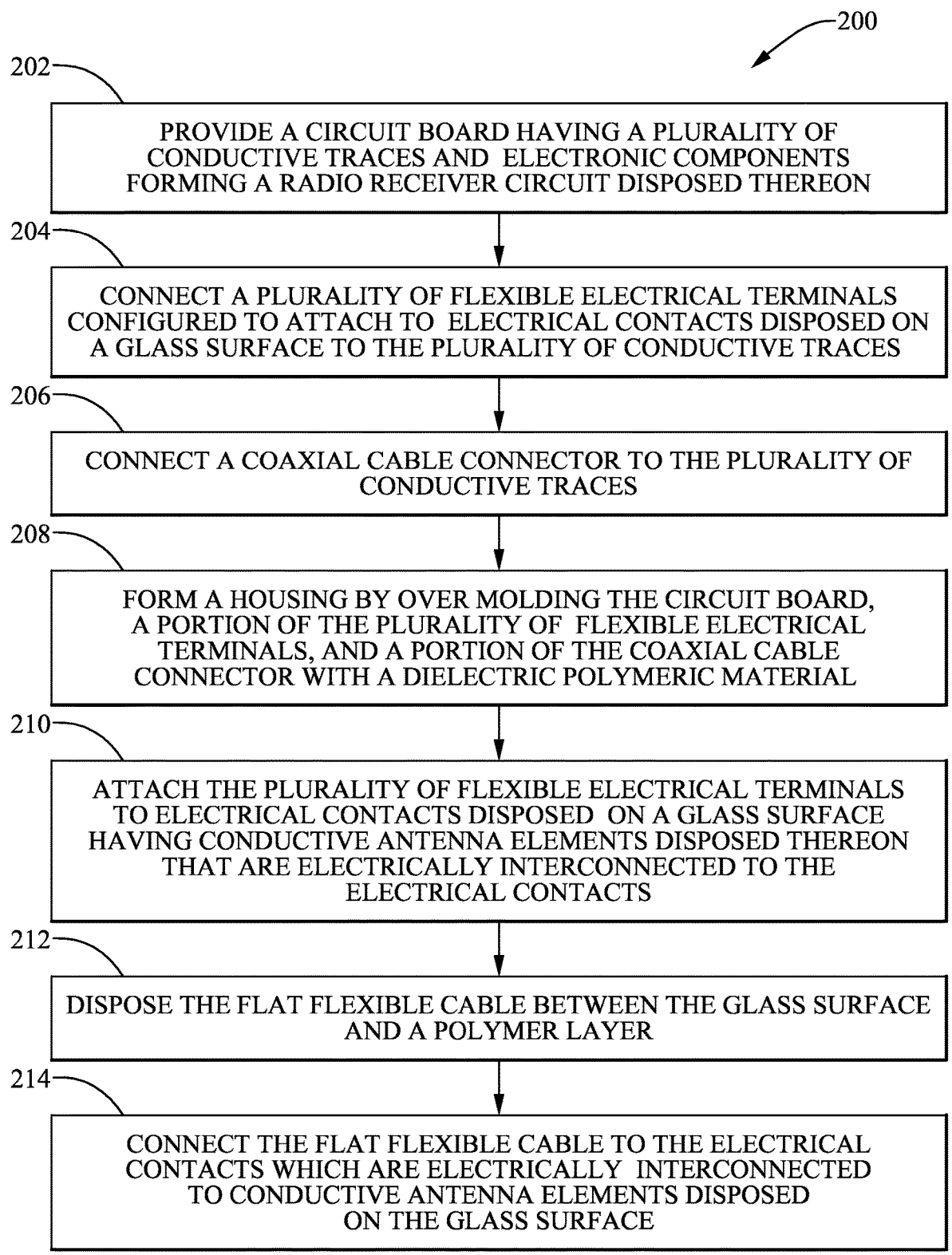
FIG. 11 is a flow chart of a method of manufacturing an electronic assembly according to some embodiments.

A method 200 of manufacturing an electronic assembly 100 is shown in the flow chart of FIG. 11. The various steps of the method 200 are outlined below:

STEP 202, PROVIDE A CIRCUIT BOARD HAVING A PLURALITY OF CONDUCTIVE TRACES AND ELECTRONIC COMPONENTS FORMING A RADIO RECEIVER CIRCUIT DISPOSED THEREON, includes providing a circuit board, e.g. a PCB 102, having a plurality of conductive traces 104 and electronic components 106 forming an electronic circuit disposed thereon;

STEP 204, CONNECT A PLURALITY OF FLEXIBLE ELECTRICAL TERMINALS CONFIGURED TO ATTACH TO ELECTRICAL CONTACTS DISPOSED ON A GLASS SURFACE TO THE PLURALITY OF CONDUCTIVE TRACES, includes connecting a plurality of flexible electrical terminals 110, 112 configured to attach to electrical contacts disposed on a glass surface 16, 18 to the plurality of conductive traces;

STEP 206, CONNECT A COAXIAL CABLE CONNECTOR TO THE PLURALITY OF CONDUCTIVE TRACES, includes connecting a coaxial cable connector 108 to the plurality of conductive traces 104;

STEP 208, FORM A HOUSING BY OVER MOLDING THE CIRCUIT BOARD, A PORTION OF THE PLURALITY OF FLEXIBLE ELECTRICAL TERMINALS, AND A PORTION OF THE COAXIAL CABLE CONNECTOR WITH A DIELECTRIC POLYMERIC MATERIAL, includes forming a housing by over molding the PCB 102, a portion of the plurality of flexible electrical terminals 110, 112, and a portion of the coaxial cable connector 108 with a dielectric polymeric material;

STEP 210, ATTACH THE PLURALITY OF FLEXIBLE ELECTRICAL TERMINALS TO ELECTRICAL CONTACTS DISPOSED ON A GLASS SURFACE HAVING CONDUCTIVE ANTENNA ELEMENTS DISPOSED THEREON THAT ARE ELECTRICALLY INTERCONNECTED TO THE ELECTRICAL CONTACTS, includes attaching the plurality of flexible electrical terminals 110, 112 to electrical contacts disposed on a glass surface 16, 18 having conductive antenna elements 12, 14 disposed thereon that are electrically interconnected to the electrical contacts;

STEP 212, DISPOSE THE FLAT FLEXIBLE CABLE BETWEEN THE GLASS SURFACE AND A POLYMER LAYER, is an optional step that includes disposing the flat flexible cable 118 between the glass surface 16 and a polymer layer; and STEP 214, CONNECT THE FLAT FLEXIBLE CABLE TO THE ELECTRICAL CONTACTS WHICH ARE ELECTRICALLY INTERCONNECTED TO CONDUCTIVE ANTENNA ELEMENTS DISPOSED ON THE GLASS SURFACE, is an optional step that includes connecting the flat flexible cable 118 to the electrical contacts which are electrically interconnected to conductive antenna elements 14 disposed on the glass surface 18.

Accordingly, an electronic assembly that is suitable for mounting to a glass window and a method of manufacturing such an electronic assembly is provided. The assembly and method provide the benefit of connecting the electronic assembly directly to antenna elements on the window, thereby eliminating the need for an externally mounted shark fin antenna module as described in the Background section above. The assembly and method also eliminate the need for an antenna amplifier module connected by a wire pigtail to the antenna elements on the window.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention is not limited to the disclosed embodiment(s), but that the invention will include all embodiments falling within the scope of the appended claims.

The invention claimed is:
1. An electronic assembly, comprising:
   a circuit board having a plurality of conductive traces and electronic components forming an electronic circuit disposed thereon;
   a plurality of flexible electrical terminals configured to attach to electrical contacts disposed on a glass surface and electrically connected to the plurality of conductive traces; and
   a coaxial cable connector electrically connected to the plurality of conductive traces.
2. The electronic assembly according to claim 1, wherein the plurality of flexible electrical terminals is formed of a sheet metal material, wherein each terminal in the plurality of flexible electrical terminals defines serpentine curves, and wherein the serpentine curves provide flexibility to the plurality of flexible electrical terminals.
3. The electronic assembly according to claim 1, wherein the electronic circuit is a radio receiver circuit.
4. The electronic assembly according to claim 1, wherein the electronic circuit is a radio transmitter circuit.
5. The electronic assembly according to claim 1, further comprising:
   a housing encasing the circuit board, a portion of the plurality of flexible electrical terminals, and a portion of the coaxial cable connector.
6. The electronic assembly according to claim 5, wherein the housing encases the circuit board, the portion of the plurality of flexible electrical terminals, and the portion of the coaxial cable connector.
7. The electronic assembly according to claim 5, wherein the housing is in intimate contact with the circuit board, the portion of the plurality of flexible electrical terminals, and the portion of the coaxial cable connector.

8. The electronic assembly according to claim 5, further comprising:
an adhesive layer disposed on an outer surface of the housing configured to secure the electronic assembly to a planar glass surface.

9. The electronic assembly according to claim 8, further comprising: the electrical contacts disposed on the glass surface; and conductive antenna elements disposed on the glass surface and electrically interconnected to the electrical contacts.

10. The electronic assembly according to claim 5, wherein the plurality of flexible electrical terminals is formed by a flat flexible cable.

11. The electronic assembly according to claim 10, further comprising:
the electrical contacts disposed on the glass surface, wherein the flat flexible cable is disposed between the glass surface and a polymer layer; and
conductive antenna elements disposed on the glass surface and electrically interconnected to the electrical contacts.

12. The electronic assembly according to claim 10, wherein the plurality of flexible electrical terminals is formed of thin conductive layers and is disposed between two polymer layers.

13. The electronic assembly according to claim 12, wherein the two polymer layers are formed of a polyimide polymer.

14. A method of manufacturing an electronic assembly, comprising:
providing a circuit board having a plurality of conductive traces and electronic components forming an electronic circuit disposed thereon;
connecting a plurality of flexible electrical terminals configured to attach to electrical contacts disposed on a glass surface to the plurality of conductive traces;
connecting a coaxial cable connector to the plurality of conductive traces; and
forming a housing by over molding the circuit board, a portion of the plurality of flexible electrical terminals, and a portion of the coaxial cable connector with a dielectric polymeric material.

15. The method according to claim 14, wherein the housing is in intimate contact with the circuit board, the portion of the plurality of flexible electrical terminals, and the portion of the coaxial cable connector.

16. The method according to claim 14, further comprising:
attaching the plurality of flexible electrical terminals to electrical contacts disposed on a glass surface having conductive antenna elements disposed thereon that are electrically interconnected to the electrical contacts; and
attaching the housing to the glass surface.

17. The method according to claim 14, wherein the plurality of flexible electrical terminals is formed by a flat flexible cable wherein the method further comprises:
disposing the flat flexible cable between the glass surface and a polymer layer; and
connecting the flat flexible cable to the electrical contacts which are electrically interconnected to conductive antenna elements disposed on the glass surface.

18. The method according to claim 14, wherein the plurality of flexible electrical terminals is formed of a sheet metal material, wherein each terminal in the plurality of flexible electrical terminals defines serpentine curves, and wherein the serpentine curves provide flexibility to the plurality of flexible electrical terminals.

19. The method according to claim 14, wherein the electronic circuit is a radio receiver circuit.

20. The method according to claim 14, wherein the electronic circuit is a radio transmitter circuit.

* * * * *